United States Patent
Hofmann et al.

(10) Patent No.: US 7,248,050 B2
(45) Date of Patent: Jul. 24, 2007

(54) NMR APPARATUS

(75) Inventors: Martin Hofmann, Rheinstetten (DE); Manfred Spraul, Ettlingenweier (DE)

(73) Assignee: Bruker Biospin GmbH, Rheinstetten (DE)

( * ) Notice: Subject to any disclaimer, the term of this patent is extended or adjusted under 35 U.S.C. 154(b) by 0 days.

(21) Appl. No.: 11/144,777

(22) Filed: Jun. 6, 2005

(65) Prior Publication Data

US 2005/0280415 A1 Dec. 22, 2005

(30) Foreign Application Priority Data

Jun. 18, 2004 (DE) .................. 10 2004 029 633

(51) Int. Cl.
*G01V 3/00* (2006.01)
(52) U.S. Cl. .................. 324/321; 324/315
(58) Field of Classification Search ............... 324/321, 324/315, 318, 322, 307, 309, 300, 319; 600/410–422
See application file for complete search history.

(56) References Cited

U.S. PATENT DOCUMENTS

| | | | |
|---|---|---|---|
| 4,581,583 A * | 4/1986 | Van Vliet et al. ........... 324/321 |
| 4,859,948 A | 8/1989 | Kuster | |
| 5,146,166 A * | 9/1992 | Bartuska ................. 324/321 |
| 5,150,054 A * | 9/1992 | Dupree .................. 324/318 |
| 5,408,181 A | 4/1995 | Dechene et al. | |
| 5,534,780 A | 7/1996 | Lilly | |
| 6,218,855 B1 * | 4/2001 | Ghosh et al. ............. 324/321 |
| 6,759,601 B1 * | 7/2004 | Petty et al. .............. 177/1 |
| 6,768,305 B1 * | 7/2004 | Keifer ................... 324/321 |
| 6,946,838 B2 * | 9/2005 | Corver et al. ............ 324/307 |
| 6,977,723 B2 * | 12/2005 | Lemmo et al. ........... 356/301 |
| 7,002,346 B2 * | 2/2006 | Schaepman et al. ....... 324/315 |

FOREIGN PATENT DOCUMENTS

| | | |
|---|---|---|
| EP | 0 502 444 | 9/1992 |
| EP | 0 516 111 | 12/1992 |
| WO | WO 03/073119 | 9/2003 |

* cited by examiner

*Primary Examiner*—Brij B. Shrivastav
(74) *Attorney, Agent, or Firm*—Paul Vincent

(57) ABSTRACT

The invention concerns an NMR apparatus (1) comprising an NMR spectrometer (2) for sequential investigation of several samples in sample containers (6) of substantially identical geometrical design, at a measuring position (10) in the NMR spectrometer (2) comprising a supply line (8) for pneumatic supply of the sample containers (6) from a magazine (3) to the measuring position (10). The apparatus is characterized in that the magazine (3) is disposed within a temperature-controlled cabinet, in particular, a cold chamber (4) and the supply line (8) can be heated. This substantially increases the throughput of samples of the NMR apparatus (1) with simple technical means.

18 Claims, 1 Drawing Sheet

NMR APPARATUS

This application claims Paris Convention priority of DE 10 2004 029 633.2 filed Jun. 18, 2004 the complete disclosure of which is hereby incorporated by reference.

BACKGROUND OF THE INVENTION

The invention concerns an NMR apparatus comprising an NMR spectrometer for sequential investigation of several samples in sample containers of substantially identical geometrical design and at a measuring position in the NMR spectrometer, with a supply line for pneumatic supply of the sample containers from a magazine to the measuring position.

A device of this type is disclosed in EP 0 502 444 A2.

NMR is used to an increasing extent in quality control laboratories. There, as well as in clinics and in combinatorial chemistry, a large number of samples are produced which must be investigated in a rapid and reliable manner (high throughput). This involves mainly screening applications which require rapid change and unambiguous identification of the sample.

EP 0 502 444 A2 describes a device, wherein several sample containers of substantially the same geometrical design are sequentially introduced into an NMR spectrometer. The sample containers are stored in a magazine and are transported from an output position of the magazine to an input position of a downpipe, which serves as a supply line to a measuring position of the NMR spectrometer, using a holder that can be displaced between the output position and the input position. The motion of the holder is controlled using a compressed air drive.

EP 516 111 A1 discloses a device having a design which is similar to that described above. The transfer between the output position of the magazine and the input position of the downpipe is effected through rotation of a drum. After the measurement, the sample containers are guided from the measuring position through a return line and into a container using compressed air.

U.S. Pat. No. 4,859,948 describes a device for introducing or discharging, a sample container into or out of a measuring position of a magnet arrangement. The sample container is disposed in a guiding tube which penetrates the magnet arrangement and can be displaced by compressed air flow. The sample container can be removed at the upper end of the guiding tube. To also ensure this with larger magnetic field arrangements without requiring auxiliary means such as e.g. ladders, a directional switch is positioned at this location which is connected to an inclined tube which connects the upper end of the magnet coil arrangement to a location which can be easily accessed.

In contrast thereto, it is the object of the present invention to considerably increase the throughput of samples in the NMR apparatus with simple technical means.

SUMMARY OF THE INVENTION

In accordance with the invention, this object is achieved in a surprisingly simple and effective manner in that the magazine is disposed within a temperature-controlled cabinet, in particular a cold chamber, wherein the supply line can be heated.

The inventive NMR apparatus supplies the NMR spectrometer with samples, which are cooled during storage, via the supply line which is temperature-controlled along the entire path. The samples are brought to the exact measuring temperature during the transport time of approximately 2–3 seconds. This avoids unnecessary waiting times that occur when the sample is only heated at the measuring position, which is usually located in an NMR spectrometer. "High throughput" means change of the samples in less than 30 s, including temperature-control and shimming.

In addition to the time reduction, a further substantial advantage of the inventive NMR arrangement is that the number of mechanical elements is minimized through use of the pneumatic tube conveyor concept. This provides high reliability and structural integrity for the overall construction.

In an advantageous embodiment, the heater is operated electrically and/or with hot air. The hot air may, in particular, be compressed gas, e.g. air or nitrogen which is also used to transport the sample, thereby performing two functions.

In a further advantageous embodiment, the magazine contains at least one, preferably a plurality of sample carrier (s) for receiving a plurality of sample containers to permit controlled reception of the plurality of samples in the magazine and rapid selection of a sample to be supplied for measurement.

In an advantageous further development, the sample carrier(s) has(ve) a well plate format. This format is used worldwide and temperature-controlled cabinets with magazines are available, which are suited for this format and can both be cooled and heated.

A preferred embodiment includes a preferably separately heatable parking position in the supply line for intermediate storage and temperature-control of one or more sample containers. If the transport time of a sample is not sufficient for heating to the measuring temperature, the sample is intermediately parked in the parking position until the desired temperature has been reached. The parking position can, of course, also receive several sample containers, if required.

In a particularly preferred further development, the parking position is disposed in a strong magnetic field, preferably in the stray magnetic field of the NMR apparatus for pre-polarization of the samples in the parking position, thereby reducing the measuring time.

In an advantageous embodiment, a bar code, preferably a 2-dimensional bar code is disposed on the sample containers and a bar code reader is disposed in the magazine and/or in the NMR spectrometer close to the measuring position, in particular, on the probe head. This bar code permits unambiguous identification of the sample containers at any time to preclude selection error.

In a preferred further development, the bar code is disposed at the bottom of the sample containers which permits reading of the bar code by conventional bar code readers either individually or in the sample carrier.

In a further preferred embodiment, the sample containers are glass tubes which meet NMR specifications. Glass is an ideal material for NMR sample containers since it does not influence the NMR measurement and permits high-precision manufacture of the sample containers.

In an alternative preferred embodiment, the sample containers are plastic tubes. Sample containers of plastic material are particularly inexpensive. In screening measurements which require only between 1 and 8 NMR scans due to the high sample concentration, disturbing signals emitted by a plastic container can be neglected.

In a particularly preferred further development, the sample containers have closing lids which are designed to prevent air columns above the sample after closure to preclude generation of foam in the sample due to residual air. To permit bubble-free closure, the opening of the sample container may also be slightly widened.

In a particularly preferred embodiment, the NMR apparatus comprises an, in particular, separate and not temperature-controlled return line for pneumatically returning the sample containers into the magazine. This ensures that the samples are returned to a cooled storage location after the measurement. Alternatively, they may also be returned through the supply line.

In a further particularly preferred embodiment, the magazine has a programmable selection device for sample containers which permits rapid and automatic transfer of a selected sample container from the magazine into the supply line.

Further advantages of the invention can be extracted from the description and the drawing. The features mentioned above and below may be used either individually or collectively in arbitrary combination. The embodiments shown and described are not to be understood as exhaustive enumeration but have exemplary character for describing the invention.

The invention is shown in the drawing and is explained in more detail with reference to embodiments.

DESCRIPTION OF THE PREFERRED EMBODIMENT

Figure 1:
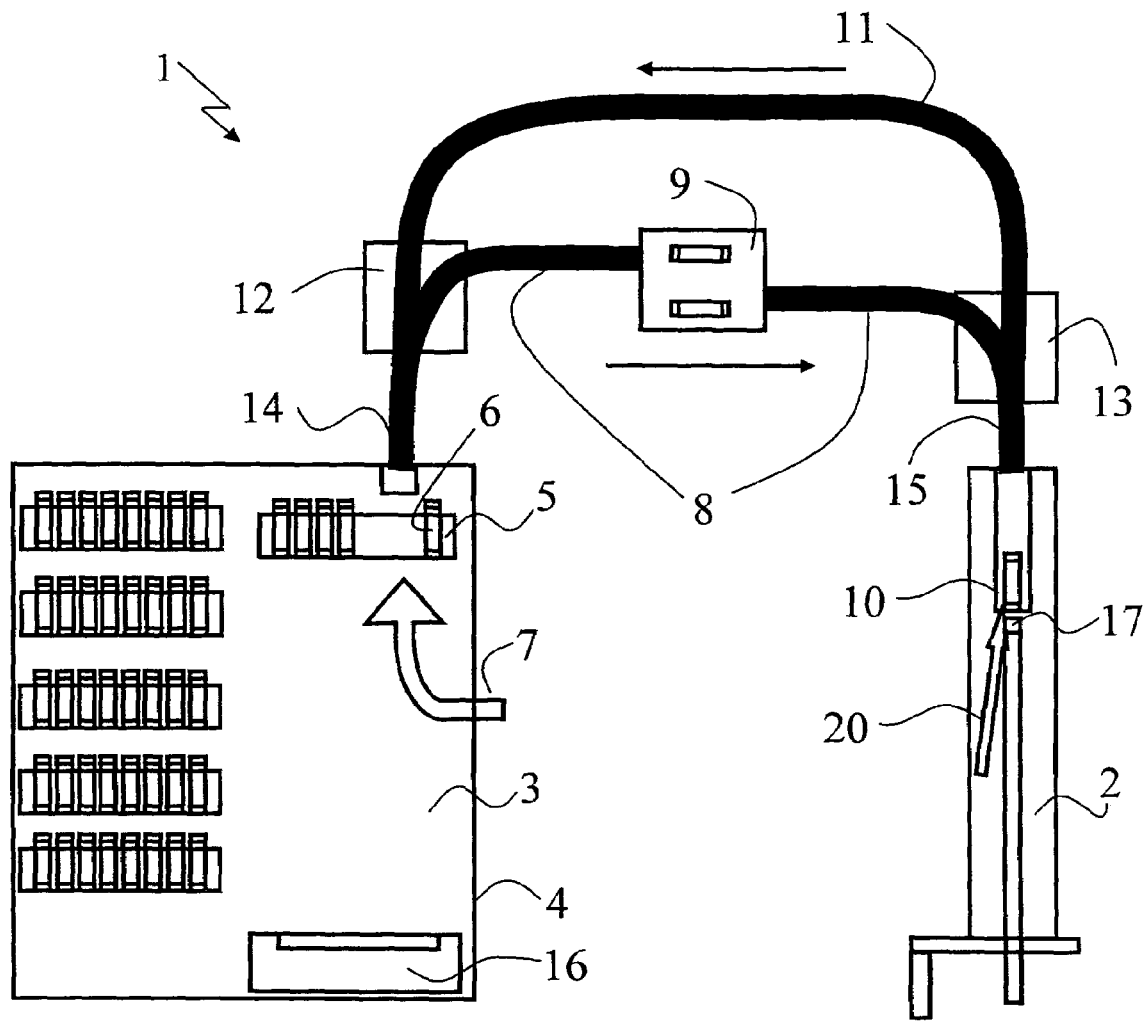
FIG. 1 shows a schematic view of an inventive NMR apparatus.

FIG. 1 shows an NMR apparatus 1 which comprises an NMR spectrometer 2 whose probe head is illustrated. The NMR apparatus 1 further comprises a magazine 3 which is housed in a cold chamber 4. The present magazine 3 has six sample carriers 5, each housing ninety-six sample containers 6. Each of the sample containers 6 holds exactly one sample. Each sample carrier 5 has a well plate format, wherein the ninety-six sample containers 6 are disposed on a space of approximately 10 cm by 14 cm. The sample containers 6 used in the sample carrier 5 have a shorter length (40–50 mm) than conventional NMR sample containers (180 mm).

A sample container 6 provided to be investigated by the NMR spectrometer 2 can be removed from the sample carrier 5 using suitable mechanics. The sample container 6 can subsequently be supplied from the magazine 3 to the NMR spectrometer 2 through a supply line 8 using a heatable transport gas such as air or nitrogen which is illustrated by a curved arrow 7 in FIG. 1.

The supply line 8 contains a parking position 9 which receives samples for intermediate storage until they have reached a temperature suited for examination in the NMR spectrometer 2. The NMR spectrometer 2 has a measuring position 10 where the samples are investigated. The sample container 6 is transferred to the measuring position 10 at the exact measuring temperature to permit immediate measurement.

After measurement, the sample is blown out using temperature-controlled transport gas 20 (illustrated by an arrow). The gas is temperature-controlled to prevent changes in the NMR spectrometer 2 conditions. A return line 11 is provided for return transport which permits return of the sample containers 6 from the measuring position 10 back into the magazine 3. The sample container 6 is moved either to its original location or is disposed at another location using the same mechanics as is used for selecting the sample container 6 from the magazine 3.

The connection between magazine 3 and NMR spectrometer 2 is formed either by the supply line 8 or the return line 11. The connection is selected by two points 12, 13 which connect two line sections 14, 15, which are commonly used by the supply line 8 and the return line 11, to either the supply line 8 or to the return line 11.

The magazine 3 comprises a bar code reader 16 for selecting a desired sample from the magazine 3. The bar code reader 16 is connected to a programmable selection device (not shown) for selecting the desired sample container 6. A second bar code reader 17 is provided in the NMR spectrometer 2 to control the identity of the sample container 6 to be measured.

Figure 2:
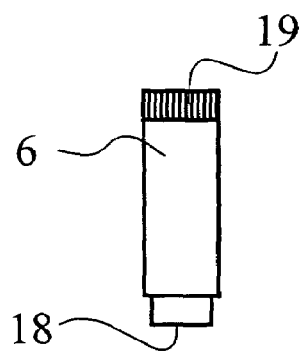
FIG. 2 shows a schematic view of a sample container for use in the NMR apparatus of FIG. 1.

FIG. 2 shows one single sample container 6 of plastic material whose lower side comprises a 2-dimensional bar code 18. It can be read by the first or second bar code reader 16, 17 to prevent mixing up of the sample containers. The first bar code reader 16 is designed to read the 2-dimensional bar code 18 of the sample container 6 when it is positioned in the sample carrier 5. Towards this end, the sample carrier 5 has openings on its lower side which correspond to the positions of the sample containers 6 in the sample carrier 5. The first bar code reader 16 can receive the entire sample carrier 5 and detect the bar codes of all sample containers 6 located therein in one step. To determine the bar code using the second bar code reader 17, the sample container 6 is inserted from above into the measuring position 10, wherein the 2-dimensional bar code 18 faces the advancing direction.

Due to the use of highly compressed transport gas for the transport, the sample containers 6 can be moved at very high speeds of more than 1 m/s which causes abrupt motion changes during acceleration and deceleration. Sample containers 6 containing residual air may thereby foam in dependence on the type of sample. To prevent this from happening, a closing lid 19 is mounted on the sample container 6 which has a particular shape to permit escape of the residual air when the closing lid 19 is mounted.

We claim:

1. An NMR apparatus for sequential investigation of a plurality of samples at a measuring position, each sample being disposed in an individual sample container of substantially identical geometrical design, the apparatus comprising:

an NMR spectrometer containing the measuring position;

a temperature controlled cabinet disposed at a substantial separation from said NMR spectrometer, said cabinet defining a cold chamber to cool the samples during storage thereof;

a magazine for holding a plurality of sample containers, said magazine disposed within said cabinet;

a supply line for pneumatic supply of the sample containers from said magazine to the measuring position in said NMR spectrometer; and means for heating said supply line.

2. The NMR apparatus of claim 1, wherein said heating means is operated with electricity and/or with hot air.

3. The NMR apparatus of claim 1, wherein said magazine contains at least one sample carrier for receiving a plurality of sample containers.

4. The NMR apparatus of claim 3, wherein said sample carrier has a well plate format.

5. The NMR apparatus of claim 1, wherein a parking position is provided in said supply line for intermediate storage and temperature-control of one or more sample container.

6. The NMR apparatus of claim 5, wherein said parking position is separately heatable.

7. The NMR apparatus of claim 5, wherein said parking position is disposed in a strong magnetic field.

8. The NMR apparatus of claim 7, wherein said strong magnetic field is a stray magnetic field of the NMR apparatus 9. The NMR apparatus of claim 1, further comprising bar codes disposed on each sample container and a bar code reader disposed in said magazine and/or in said NMR spectrometer close to the measuring position.

10. The NMR apparatus of claim 9, wherein said bar codes are 2-dimensional bar codes.

11. The NMR apparatus of claim 9, wherein each bar code reader is disposed in an NMR spectrometer probe head.

12. The NMR apparatus of claim 9, wherein each bar code is disposed at a bottom of said sample container.

13. The NMR apparatus of claim 1, wherein said sample containers are glass tubes which meet NMR specifications.

14. The NMR apparatus of claim 1, wherein said sample containers are plastic tubes.

15. The NMR apparatus of claim 1, wherein said sample containers comprise closing lids which are designed to prevent formation of air columns above the sample after closure.

16. The NMR apparatus of claim 1, further comprising a return line for pneumatic return of said sample containers into said magazine.

17. The NMR apparatus of claim 16, wherein said return line is separate and is not temperature-controlled.

18. The NMR apparatus of claim 1, wherein said magazine comprises a programmable selection device for said sample containers.

* * * * *